(12) United States Patent
Pindl et al.

(10) Patent No.: US 9,899,574 B2
(45) Date of Patent: Feb. 20, 2018

(54) METHOD FOR PRODUCING AN OPTOELECTRONIC COMPONENT, AND OPTOELECTRONIC COMPONENT

(71) Applicant: OSRAM Opto Semiconductors GmbH, Regensburg (DE)

(72) Inventors: Markus Pindl, Tegernheim (DE); Juergen Moosburger, Lappersdorf (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 15/508,868

(22) PCT Filed: Aug. 26, 2015

(86) PCT No.: PCT/EP2015/069534
§ 371 (c)(1),
(2) Date: Mar. 3, 2017

(87) PCT Pub. No.: WO2016/034472
PCT Pub. Date: Mar. 10, 2016

(65) Prior Publication Data
US 2017/0263825 A1    Sep. 14, 2017

(30) Foreign Application Priority Data
Sep. 5, 2014  (DE) .................. 10 2014 112 818

(51) Int. Cl.
*H01L 21/00*    (2006.01)
*H01L 33/48*    (2010.01)
(Continued)

(52) U.S. Cl.
CPC ............ *H01L 33/486* (2013.01); *H01L 33/54* (2013.01); *H01L 33/60* (2013.01); *H01L 33/62* (2013.01);
(Continued)

(58) Field of Classification Search
CPC ......... H01L 33/10; H01L 33/54; H01L 33/60; H01L 33/62; H01L 33/382; H01L 33/486
(Continued)

(56) References Cited

U.S. PATENT DOCUMENTS 7,687,815 B2 *   3/2010  Kim ................... H01L 33/486
                                                    257/291
8,633,503 B2 *   1/2014  Seo ................... H01L 33/486
                                                    257/778
(Continued)

FOREIGN PATENT DOCUMENTS

DE          10041328 A1    3/2002
DE      102009036621 A1    2/2011
(Continued)

*Primary Examiner* — Brook Kebede
(74) *Attorney, Agent, or Firm* — Slater Matsil, LLP

(57) ABSTRACT

A method for producing an optoelectronic component and an optoelectronic component are disclosed. In an embodiment, the method includes arranging an optoelectronic semiconductor chip and a reflector on a top side of a carrier film, arranging a potting material in a region between the optoelectronic semiconductor chip and the reflector and forming a molded body, wherein the optoelectronic semiconductor chip, the reflector and the potting material are embedded into the molded body.

18 Claims, 5 Drawing Sheets

(51) Int. Cl.
*H01L 33/54* (2010.01)
*H01L 33/60* (2010.01)
*H01L 33/62* (2010.01)

(52) U.S. Cl.
CPC *H01L 2933/005* (2013.01); *H01L 2933/0058* (2013.01)

(58) Field of Classification Search
USPC ............................... 257/97–100; 438/26, 27
See application file for complete search history.

(56) References Cited

U.S. PATENT DOCUMENTS

| | | |
|---|---|---|
| 8,735,928 B2 | 5/2014 | Jäger et al. |
| 2013/0032842 A1 | 2/2013 | Park et al. |
| 2013/0337591 A1 | 12/2013 | Chen |
| 2016/0005936 A1 | 1/2016 | Illek et al. |

FOREIGN PATENT DOCUMENTS

| | | |
|---|---|---|
| DE | 102010025319 A1 | 12/2011 |
| DE | 102012213581 A1 | 2/2013 |
| DE | 102013202906 A1 | 8/2014 |
| EP | 2161765 A2 | 3/2010 |
| EP | 2680327 A2 | 1/2014 |
| JP | 2000261041 A | 9/2000 |
| JP | 2009070869 A | 4/2009 |
| JP | 2012094787 A | 5/2012 |
| WO | 2011015449 A1 | 2/2011 |
| WO | 2013116623 A1 | 8/2013 |

\* cited by examiner

METHOD FOR PRODUCING AN OPTOELECTRONIC COMPONENT, AND OPTOELECTRONIC COMPONENT

This patent application is a national phase filing under section 371 of PCT/EP2015/069534, filed Aug. 26, 2015, which claims the priority of German patent application 10 2014 112 818.4, filed Sep. 5, 2014, each of which is incorporated herein by reference in its entirety.

TECHNICAL FIELD

The present invention relates to a method for producing an optoelectronic component according to patent claim 1, and to an optoelectronic component according to patent claim 17.

BACKGROUND

In the prior art it is known to form optoelectronic components, for example, light-emitting diode components (LED components), with housings produced by molding methods. DE 10 2009 036 621 A1 discloses a method in which an optoelectronic semiconductor chip is embedded directly and without further carriers into a molded body produced by a molding method. In this case, a front side and a rear side of the optoelectronic semiconductor chip are left such that they are not covered by the molded body, in order to enable an electrical contacting of the optoelectronic semiconductor chip. The optoelectronic component obtainable by this method comprises very compact external dimensions.

SUMMARY OF THE INVENTION

Embodiments of the invention provide a method for producing an optoelectronic component. Further embodiments of the invention provide an optoelectronic component. In various embodiments a method for producing an optoelectronic component comprises steps for arranging an optoelectronic semiconductor chip and a reflector on a top side of a carrier film, for arranging a potting material in a region between the optoelectronic semiconductor chip and the reflector, and for forming a molded body, wherein the optoelectronic semiconductor chip, the reflector and the potting material are embedded into the molded body. Advantageously, the optoelectronic component obtainable by this method comprises very compact external dimensions. In this method, the optoelectronic semiconductor chip is arranged in a cavity which is formed in the molded body and which is delimited by the reflector and filled with the potting material. The potting material may protect the optoelectronic semiconductor chip against damage resulting from external influences. The reflector may serve to reflect electromagnetic radiation, for example, visible light, emitted by the optoelectronic semiconductor chip and to guide it out of the optoelectronic component in order to make it accessible to a use.

In one embodiment of the method, the molded body is formed such that a surface of the optoelectronic semiconductor chip facing away from the carrier film is covered by the molded body. In this case, the method comprises a further step for removing a part of the molded body in order to at least partly uncover the surface of the optoelectronic semiconductor chip facing away from the carrier film. Advantageously, as a result, during the formation of the molded body, the method does not require a cover of the surface of the optoelectronic semiconductor chip facing away from the carrier film, said cover serving to protect the surface of the optoelectronic semiconductor chip facing away from the carrier film from being covered by the material of the molded body, as a result of which the method is advantageously implementable particularly simply and cost-effectively. Removing the part of the molded body may be performed, for example, by means of a grinding-back process.

In one embodiment of the method, the molded body is formed such that the reflector is uncovered on a rear side of the molded body facing away from the carrier film. This advantageously enables an electrical contacting of the reflector on the rear side of the molded body.

In one embodiment of the method, the latter comprises a further step for detaching the molded body from the carrier film. Advantageously, a surface of the optoelectronic semiconductor chip facing the carrier film and a front side of the molded body facing the carrier film are uncovered as a result.

In one embodiment of the method, the latter comprises a further step for arranging a metallization on a front side and/or a rear side of the molded body. The metallization may be arranged on the molded body, for example, in order to create electrical soldering contact pads of the optoelectronic component obtainable by the method. The metallization arranged on the front side and/or the rear side of the molded body may also serve to create planar electrical connections between electrical connection faces of the optoelectronic semiconductor chip and electrical soldering contact pads of the optoelectronic component obtainable by the method. Arranging the metallization on the front side and/or the rear side of the molded body may be performed by means of vapor deposition, for example.

In one embodiment of the method, an electrically conductive connection between an electrical connection face of the optoelectronic semiconductor chip and the reflector is formed by the metallization. Advantageously, as a result, the reflector in the optoelectronic component obtainable by the method may serve to lead an electrical contact to the electrical connection face of the optoelectronic semiconductor chip of the optoelectronic component through the molded body of the optoelectronic component. As a result, the optoelectronic component may advantageously be produced particularly cost-effectively and with particularly compact external dimensions.

In one embodiment of the method, an electrically conductive contact element is arranged on the top side of the carrier film and is embedded together with the optoelectronic semiconductor chip into the molded body. In this case, an electrically conductive connection between a front side and a rear side of the molded body is formed by the contact element. Advantageously, the contact element in the optoelectronic component obtainable by this method may serve to lead an electrical connection to an electrical connection face of the optoelectronic semiconductor chip through the molded body of the optoelectronic component.

In one embodiment of the method, an electrically conductive connection between an electrical connection face of the optoelectronic semiconductor chip and the contact element is formed by the metallization. Advantageously, the metallization and the contact element in the optoelectronic component obtainable by this method produce an electrically conductive connection to the electrical connection face of the optoelectronic semiconductor chip, said electrically conductive connection extending through the molded body of the optoelectronic component.

In one embodiment of the method, firstly the reflector is arranged on the carrier film and then the optoelectronic semiconductor chip is arranged on the carrier film. This advantageously makes it possible to align the optoelectronic semiconductor chip with the reflector, already arranged on the carrier film, during the arrangement of the optoelectronic semiconductor chip on the carrier film. This enables a particularly accurate relative positioning of the reflector and the optoelectronic semiconductor chip with respect to one another. As a result, the method may advantageously be implemented simply and with high precision.

In one embodiment of the method, the reflector is formed as a metal sheet comprising embossing structures. Advantageously, the reflector comprises particularly expedient optical reflection properties in this case. Moreover, the reflector formed as a metal sheet comprising embossing structures, as a result of its embedding into the molded body, may advantageously mechanically stabilize the molded body of the optoelectronic component obtainable by the method.

In one embodiment of the method, the optoelectronic semiconductor chip is arranged on the carrier film such that a light-emitting surface of the optoelectronic semiconductor chip faces the carrier film. Advantageously, the light-emitting surface of the optoelectronic semiconductor chip is left such that it is not covered by the material of the molded body during the formation of the molded body, as a result of which electromagnetic radiation emitted at the light-emitting surface of the optoelectronic semiconductor chip may advantageously be emitted in an unimpeded manner in the case of the optoelectronic component obtainable by the method.

In one embodiment of the method, the optoelectronic semiconductor chip is formed as a volume emitting light-emitting diode chip. Advantageously, in the case of the optoelectronic component obtainable by this method, electromagnetic radiation emitted at side faces of the optoelectronic semiconductor chip formed as a volume emitting light-emitting diode chip may be reflected at the reflector and thereby guided out of the optoelectronic component obtainable by the method and may be supplied for a use.

In one embodiment of the method, arranging the potting material is performed by means of a dosing method. By way of example, arranging the potting material may be performed by means of needle dosing (dispensing). Advantageously, a dosing method enables a particularly accurate dimensioning of the quantity of the potting material that is arranged in the region between the optoelectronic semiconductor chip and the reflector.

In one embodiment of the method, the potting material is arranged such that a surface of the optoelectronic semiconductor chip facing away from the carrier film is not covered by the potting material. Advantageously, the surface of the optoelectronic semiconductor chip facing away from the carrier film remains free as a result, which makes it possible to contact an electrical contact pad of the optoelectronic semiconductor chip that is arranged on that surface of the optoelectronic semiconductor chip which faces away from the carrier film.

In one embodiment of the method, the molded body is formed by compression molding. This advantageously enables a simple and cost-effective implementation of the method.

In one embodiment of the method, a plurality of optoelectronic semiconductor chips is embedded into the molded body. In this case, the method comprises a further step for dividing the molded body in order to obtain a plurality of optoelectronic components. As a result, the method enables parallel production of a plurality of optoelectronic components in common work processes. This makes it possible to reduce the production costs per individual optoelectronic component.

An optoelectronic component comprises an optoelectronic semiconductor chip and a reflector. A potting material is arranged in a region between the optoelectronic semiconductor chip and the reflector. The optoelectronic semiconductor chip, the reflector and the potting material are embedded into a molded body. A front side of the optoelectronic semiconductor chip terminates flush with a front side of the molded body. A rear side of the optoelectronic semiconductor chip terminates flush with a rear side of the molded body. Advantageously, this optoelectronic component comprises very compact external dimensions. The optoelectronic semiconductor chip in this optoelectronic component is arranged in a cavity which is formed in the molded body and which is filled with the potting material and delimited by the reflector. Electromagnetic radiation emitted by the optoelectronic semiconductor chip of the optoelectronic component may be reflected at the reflector and, in this way, guided out of the optoelectronic component and supplied for a use. The optoelectronic semiconductor chip may be formed, for example, as a volume emitting light-emitting diode chip. The rear side of the optoelectronic semiconductor chip of the optoelectronic component, said rear side terminating flush with the rear side of the molded body on the rear side of the molded body, enables a simple electrical contacting of the optoelectronic semiconductor chip of the optoelectronic component. The front side of the optoelectronic semiconductor chip, said front side terminating flush with the front side of the molded body on the front side of the molded body, equally enables a simple electrical contacting of the optoelectronic semiconductor chip of the optoelectronic component.

In one embodiment of the optoelectronic component, an electrically conductive contact element is embedded into the molded body. A front side of the contact element terminates flush with the front side of the molded body. A rear side of the contact element terminates flush with the rear side of the molded body. The contact element thereby extends between the front side of the molded body and the rear side of the molded body through the molded body. The contact element thus forms a plated-through hole which extends through the molded body and which makes it possible, for example, to lead an electrically conductive connection to an electrical connection face of the optoelectronic semiconductor chip through the molded body of the optoelectronic component.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in a schematic illustration in each case.

DETAILED DESCRIPTION OF ILLUSTRATIVE EMBODIMENTS

Figure 1:
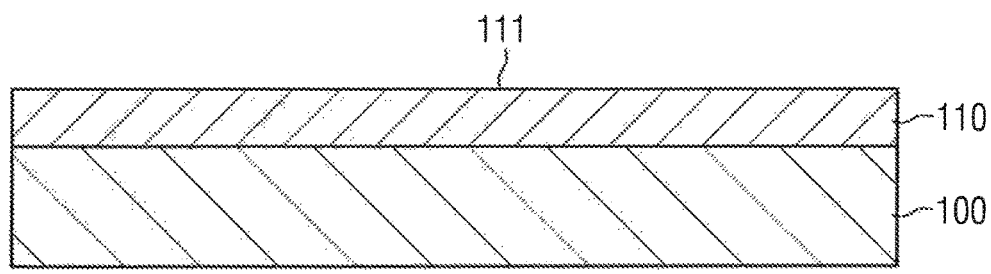
FIG. 1 shows a sectional view of a carrier with a carrier film.

FIG. 1 shows a schematic sectional side view of a carrier 100. The carrier 100 may be part of an installation or of a tool for carrying out a molding method, for example, part of an installation for compression molding. In this case, the carrier 100 forms a part of the mold of said installation.

In the example illustrated schematically in FIG. 1, the carrier 100 comprises a substantially planar top side. A carrier film 110 is arranged on the top side of the carrier 100, said carrier film comprising a top side 111 facing away from the carrier 100. The carrier film 110 may be formed, for example, as an adhesive film. Preferably, the carrier film 110 comprises a releasable adhesive layer, for example, a thermally releasable adhesive layer, on its top side 111 and/or on its underside opposite the top side 111.

Figure 2:
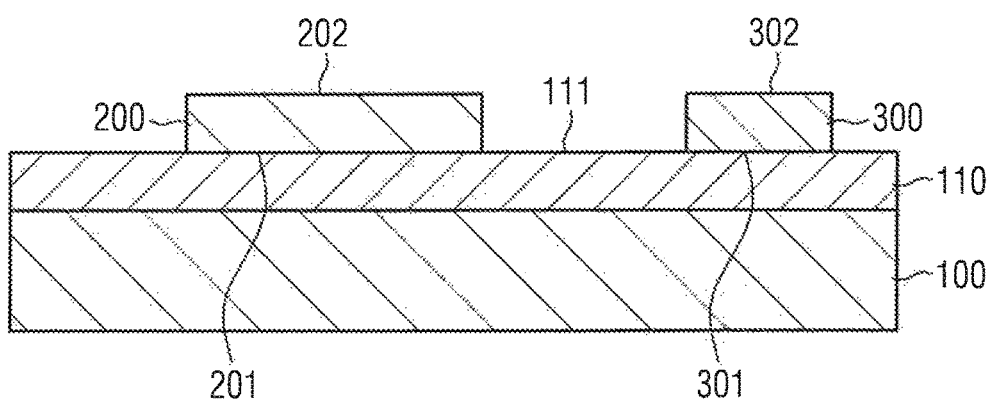
FIG. 2 shows a sectional view of the carrier with an optoelectronic semiconductor chip arranged on the carrier film and with a contact element arranged on the carrier film.

FIG. 2 shows a schematic sectional side view of the carrier 100 and of the carrier film 110 in a processing state temporally succeeding the illustration in FIG. 1. An optoelectronic semiconductor chip 200 and a contact element 300 have been arranged on the top side 111 of the carrier film 110. The optoelectronic semiconductor chip 200 and the contact element 300 are arranged alongside one another laterally at a distance from one another.

The optoelectronic semiconductor chip 200 is configured to emit electromagnetic radiation, for example, visible light. The optoelectronic semiconductor chip 200 may be formed, for example, as a light-emitting diode chip (LED chip). The optoelectronic semiconductor chip 200 comprises a front side 201 and a rear side 202 opposite the front side 201. The front side 201 of the optoelectronic semiconductor chip 200 may form, for example, a radiation emission face of the optoelectronic semiconductor chip 200, at which electromagnetic radiation is emitted during the operation of the optoelectronic semiconductor chip 200. The optoelectronic semiconductor chip 200 may also be formed as a volume emitting semiconductor chip. In this case, during the operation of the optoelectronic semiconductor chip 200, electromagnetic radiation may also be emitted at side faces of the optoelectronic semiconductor chip 200 that connect the front side 201 and the rear side 202.

The optoelectronic semiconductor chip 200 is arranged on the top side 111 of the carrier film 100 on the carrier 100 in such a way that the front side 201 of the optoelectronic semiconductor chip 200 faces the top side 111 of the carrier film 110 and is in contact with the latter.

The contact element 300 comprises an electrically conductive material, for example, a doped semiconductor material or a metal. The contact element 300 may also be referred to as a via chip. The contact element 300 comprises a top side 301 and an underside 302 opposite the top side 301. There is an electrically conductive connection between the top side 301 and the underside 302 of the contact element 300.

The contact element 300 is arranged on the top side 111 of the carrier film 110 on the carrier 100 in such a way that the top side 301 of the contact element 300 faces the top side 111 of the carrier film 110 and is in contact with the latter.

The optoelectronic semiconductor chip 200 and the contact element 300 comprise the same height, within the scope of production accuracy, in a direction perpendicular to the top side 111 of the carrier film 110. That means that the front side 201 of the optoelectronic semiconductor chip 200 and the top side 301 of the contact element 300 are arranged in a common plane on the top side 111 of the carrier film 110 on the carrier 100. The rear side 202 of the optoelectronic semiconductor chip 200 and the underside 302 of the contact element 300 also lie substantially in a common plane.

Figure 3:
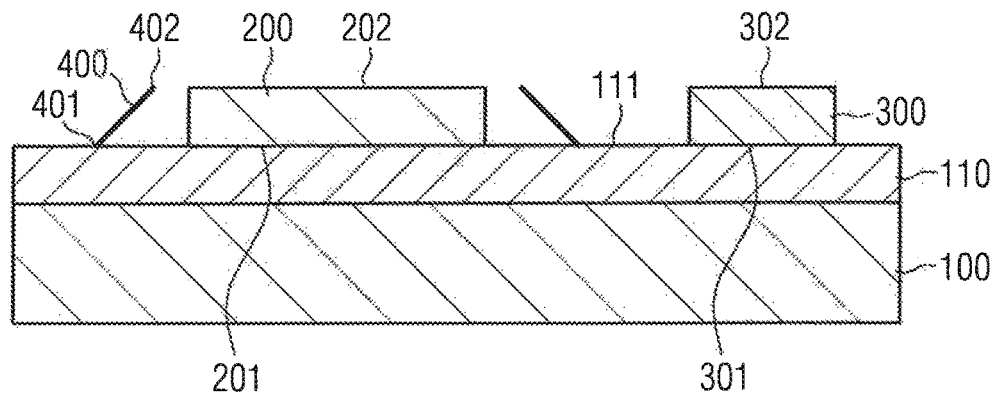
FIG. 3 shows a sectional view of the carrier with a reflector arranged on the carrier film.

FIG. 3 shows a schematic sectional side view of the carrier 100, of the optoelectronic semiconductor chip 200 arranged on the top side 111 of the carrier film 110, and of the contact element 300 in a processing state temporally succeeding the illustration in FIG. 2. A reflector 400 has been arranged on the top side 111 of the carrier film 110 on the carrier 100.

The reflector 400 comprises an optically highly reflective material. Preferably, the material of the reflector 400 is also electrically conductive and mechanically stable. The reflector 400 may be formed from metal, for example. Preferably, the reflector 400 is formed as an embossed metal sheet.

The reflector 400 comprises an embossed reflector structure, which may comprise, for example, the form of the lateral surface of a truncated cone or of a truncated pyramid. The reflector 400 is arranged on the top side 111 of the carrier film 110 on the carrier 100 in such a way that the reflector structure surrounds the optoelectronic semiconductor chip 200 in a ring-shaped fashion. Preferably, the optoelectronic semiconductor chip 200 is arranged approximately centrally in the ring-shaped reflector structure of the reflector 400.

The reflector structure of the reflector 400 comprises a front side 401 and a rear side 402 opposite the front side 401. In this case, the front side 401 of the reflector structure of the reflector 400 faces the top side 111 of the carrier film 110 and is in contact with the latter. The embossed reflector structure of the reflector 400 widens conically from the rear side 402 to the top side 401.

The reflector 400 may comprise further sections besides the embossed reflector structure, said further sections not being illustrated in FIG. 3. By way of example, the reflector 400 may comprise on its front side 401 sheet sections which are adjacent to the embossed reflector structure and which bear on the top side 111 of the carrier film 110 on the carrier 100. However, on the rear side 402 of the reflector 400 as well, further sections of the reflector 400 may be adjacent to the embossed reflector structure of the reflector 400.

The reflector 400 is arranged on the top side 111 of the carrier film 110 on the carrier 100 in such a way that both the optoelectronic semiconductor chip 200 and the contact element 300 are not in contact with the reflector 400 and are thus electrically insulated from the reflector 400.

In the example illustrated, the reflector 400 comprises between its rear side 402 and its front side 401 a height perpendicular to the top side 111 of the carrier film 110, which height substantially corresponds to the height of the optoelectronic semiconductor chip 200 between the rear side 202 thereof and the front side 201 thereof. However, it would also be possible to form the reflector 400 with a smaller height. In this case, the rear side 402 of the reflector 400 lies closer to the top side 111 of the carrier film 110 than the rear side 202 of the optoelectronic semiconductor chip 200.

In a departure from the illustration in FIGS. 2 and 3 and the description given above, it is also possible to arrange the reflector 400 temporally before the optoelectronic semiconductor chip 200 and/or before the contact element 300 on the top side 111 of the carrier film 110 on the carrier 100. This affords the advantage that the optoelectronic semiconductor chip 200, after the process of arranging the reflector 400 on the top side 111 of the carrier film 110, may be aligned with the embossed reflector structure of the reflector 400 and be positioned on the top side 111 of the carrier film 110 on the carrier 100.

Figure 4:
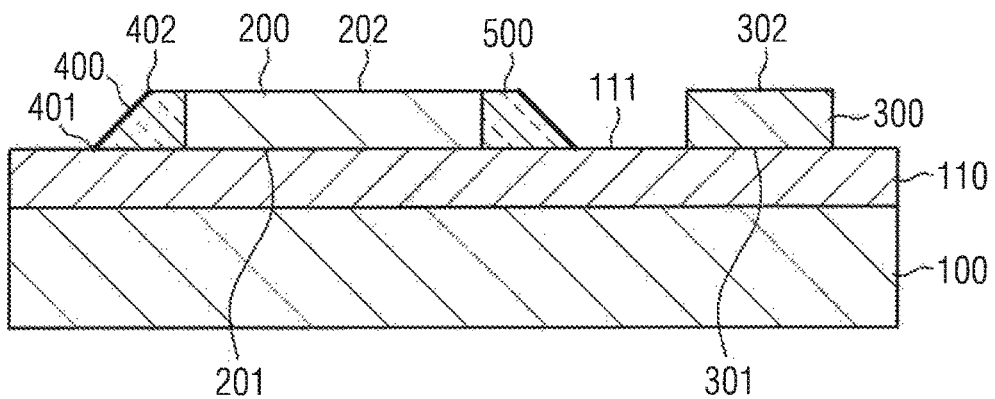
FIG. 4 shows a sectional view of the carrier with a potting material arranged between the optoelectronic semiconductor chip and the reflector.

FIG. 4 shows a schematic sectional side view of the carrier 100 with the elements arranged on the top side 111 of the carrier film 110 in a processing state temporally succeeding the illustration in FIG. 3. A region between the optoelectronic semiconductor chip 200 and the reflector 400 on the top side 111 of the carrier film 110 on the carrier 100 has been filled with a potting material 500.

The potting material 500 is preferably substantially transparent or translucent to electromagnetic radiation emitted by the optoelectronic semiconductor chip 200. The potting material 500 may comprise a silicone, for example.

The potting material 500 may be arranged in the region between the optoelectronic semiconductor chip 200 and the reflector 400, for example, by means of a dosing method. In particular, the potting material 500 may be arranged by means of needle dosing, for example. The potting material 500 fills the region between the optoelectronic semiconductor chip 200 and the embossed reflector structure of the reflector 400 in this case proceeding from the top side 111 of the carrier film 110. Preferably, the amount of potting material 500 filled into the region between the optoelectronic semiconductor chip 200 and the reflector 400 is such that the potting material 500 terminates approximately flush with the rear side 402 of the reflector 400. A wetting of the rear side 202 of the optoelectronic semiconductor chip 200 by the potting material 500 should be avoided.

Figure 5:
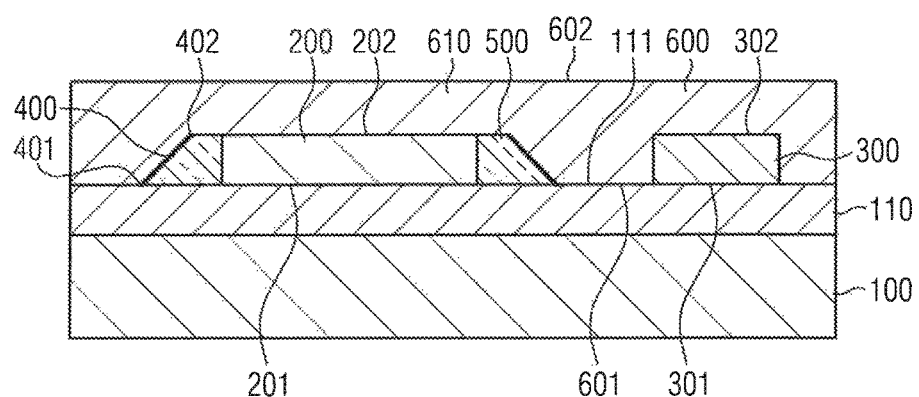
FIG. 5 shows a sectional view of the carrier with a molded body formed above the carrier film, into which molded body the optoelectronic semiconductor chip, the contact element, the reflector and the potting material are embedded.

FIG. 5 shows a schematic sectional side view of the carrier 100 and of the component parts arranged on the top side 111 of the carrier film 110 in a processing state temporally succeeding the illustration in FIG. 4. A molded body 600 has been formed on the top side 111 of the carrier film 110 on the carrier 100. The optoelectronic semiconductor chip 200, the contact element 300, the reflector 400 and the potting material 500 arranged in the region between the optoelectronic semiconductor chip 200 and the reflector 400 have been embedded into the molded body 600.

The molded body 600 may be produced by means of a molding process, in particular, for example, by compression molding. In this case, a molding material is introduced into a mold formed by the carrier 100 and a further mold part located opposite the top side 111 of the carrier film 110 arranged on the carrier 100. The molded body 600 comprising a front side 601 and a rear side 602 opposite the front side 601 is formed thereby. The front side 601 of the molded body 600 faces the top side 111 of the carrier film 110. The rear side 602 of the molded body 600 is formed on the further mold part located opposite the carrier 100.

The molding material used for forming the molded body 600 is preferably a plastics material. The molding material may comprise a silicone or an epoxy resin, for example. The molding material used for forming the molded body 600 may be transparent, translucent or else opaque.

The optoelectronic semiconductor chip 200, the contact element 300, the reflector 400 and the potting material 500 arranged between the optoelectronic semiconductor chip 200 and the reflector 400 are embedded into the molded body 600 during the formation of the molded body 600. In this case, the front side 201 of the optoelectronic semiconductor chip 200 bearing on the top side 111 of the carrier film 110, the top side 301 of the contact element 300 and the front side 401 of the reflector 400 are not covered by the material of the molded body 600 and terminate substantially flush with the front side 601 of the molded body 600 after the formation of the molded body 600.

The height of the molded body 600 dimensioned from the rear side 602 to the front side 601 of the molded body 600 in a direction perpendicular to the top side 111 of the carrier film 110, in the example illustrated in FIG. 5, is greater than the height of the optoelectronic semiconductor chip 200, of the contact element 300 and of the reflector 400. As a result, the rear side 202 of the optoelectronic semiconductor chip 200, the underside 302 of the contact element 300, the rear side 402 of the reflector 400 and the potting material 500 arranged between the optoelectronic semiconductor chip 200 and the reflector 400 are covered by a part 610 of the molded body 600 that adjoins the rear side 602 of the molded body 600.

However, it is also possible to form the molded body 600 with a thickness corresponding to the height of the optoelectronic semiconductor chip 200, of the contact element 300 and of the reflector 400, such that the rear side 302 of the optoelectronic semiconductor chip 200, the underside 302 of the contact element 300, the rear side 402 of the reflector 400 and the potting material 500 arranged between the optoelectronic semiconductor chip 200 and the reflector 400 are also not covered by the material of the molded body 600 and thereby terminate substantially flush with the rear side 602 of the molded body 600. This may be achieved, for example, by virtue of the fact that the rear side 202 of the optoelectronic semiconductor chip 200, the underside 302 of the contact element 300, the rear side 402 of the reflector 400 and the potting material 500 arranged between the optoelectronic semiconductor chip 200 and the reflector 400 are covered by means of a film during the formation of the molded body 600.

Figure 6:
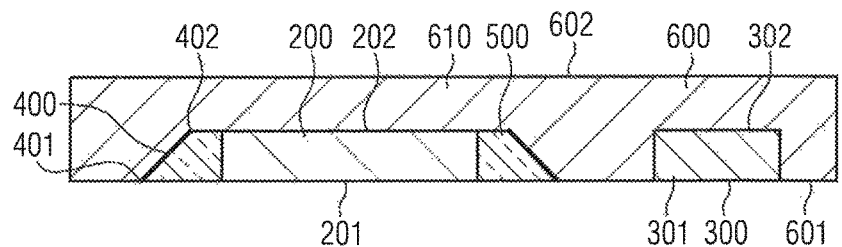
FIG. 6 shows a sectional view of the molded body after detachment from the carrier film.

FIG. 6 shows a schematic sectional side view of the molded body 600 in a processing state temporally succeeding the illustration in FIG. 5. The molded body 600 has been detached from the top side 111 of the carrier film 110, and thus also from the carrier 100.

Detaching the molded body 600 from the top side 111 of the carrier film 110 may be performed, for example, by means of a thermal or chemical treatment of the carrier film 110, by means of an irradiation of the carrier film 110 with light or by means of some other treatment of the carrier film 110. However, detaching the molded body 600 from the top side 111 of the carrier film 110 may also be performed by means of purely mechanical measures.

Figure 7:
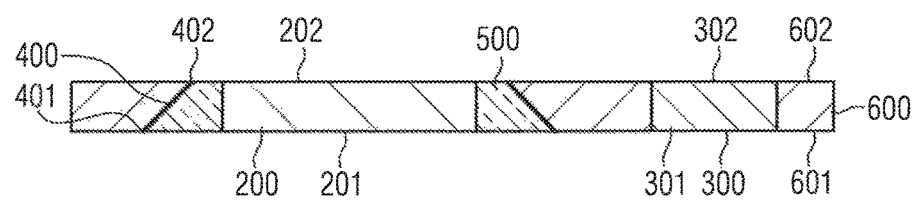
FIG. 7 shows a sectional view of the molded body after removal of a part of the molded body.

FIG. 7 shows a schematic sectional side view of the molded body 600 in a processing state temporally succeeding the illustration in FIG. 6. The part 610 of the molded body 600 that adjoins the rear side 602 of the molded body 600 has been removed.

As a result of the removing of the part 610 of the molded body 600 that adjoins the rear side 602 of the molded body 600, the rear side 202 of the optoelectronic semiconductor chip 200, the underside 302 of the contact element 300, the rear side 402 of the reflector 400 and the potting material 500 arranged between the optoelectronic semiconductor chip 200 and the reflector 400 have been uncovered and now terminate approximately flush with the set-back rear side 602 of the molded body 600. Removing the part bio of the molded body 600 that adjoins the rear side 602 of the molded body may be performed by means of a grinding process, for example.

If the molded body 600 is already produced during the formation of the molded body 600 in the processing state illustrated in FIG. 5 such that the rear side 202 of the optoelectronic semiconductor chip 200, the underside 302 of the contact element 300, the rear side 402 of the reflector 400 and the potting material 500 arranged between the optoelectronic semiconductor chip 200 and the reflector 400 are not covered by the molded body 600 and terminate substantially flush with the rear side 602 of the molded body 600, then removing the part bio of the molded body 600 that adjoins the rear side 602 may be omitted.

Figure 8:
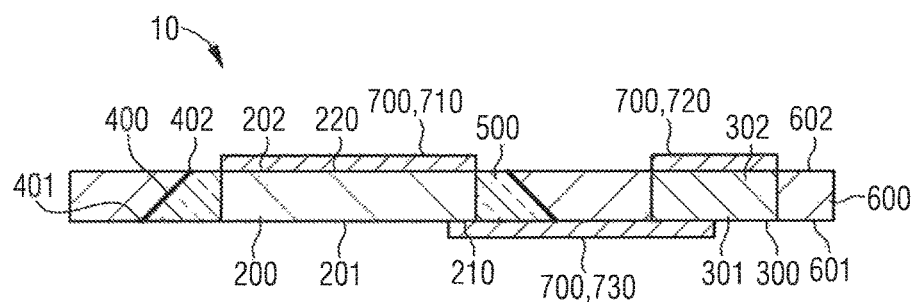
FIG. 8 shows a sectional side view of a first optoelectronic component.

FIG. 8 shows a schematic sectional side view of the molded body 600 and of the component pails embedded into the molded body 600 in a processing state temporally succeeding the illustration in FIG. 7. A metallization 700 has been arranged on the rear side 602 and the front side 601 of the molded body 600. As a result of the further processing, a first optoelectronic component 10 has been formed from the molded body 600 and the component parts embedded into the molded body 600.

Arranging the metallization 700 on the front side 601 and the rear side 602 of the molded body 600 may be performed, for example, by means of vapor deposition or by means of some other planar coating method. The metallization 700 comprises an electrically conductive metal. The arrangement of the metallization 700 on front side 601 and rear side 602 of the molded body 600 may be performed successively in separate work processes. In this case, different materials may also be used.

The metallization 700 comprises a first soldering contact pad 710 arranged on the rear side 202 of the optoelectronic semiconductor chip 200. The first soldering contact pad 710 is electrically conductively connected to a rear-side electrical connection face 220 on the rear side 202 of the optoelectronic semiconductor chip 200.

The metallization 700 further comprises a second soldering contact pad 720 arranged on the underside 302 of the contact element 300. The second soldering contact pad 720 is electrically conductively connected to the contact element 300.

Furthermore, the metallization 700 comprises a connection section 730 arranged on the front side 601 of the molded body 600. The connection section 730 extends on the front side 601 of the molded body 600 from the front side 201 of the optoelectronic semiconductor chip 200 embedded into the molded body 600 as far as the top side 301 of the contact element 300 embedded into the molded body 600.

The connection section 730 is electrically conductively connected to a front-side electrical connection face 210 of the optoelectronic semiconductor chip 200, said front-side electrical connection face being formed on the front side 201 of the optoelectronic semiconductor chip 200. Moreover, the connection section 730 is electrically conductively connected to the contact element 300. The connection section 730 thus also produces an electrically conductive connection between the front-side electrical connection face 210 of the optoelectronic semiconductor chip 200 and the second soldering contact pad 720 on the rear side 602 of the molded body 600.

The soldering contact pads 710, 720 arranged on the rear side 602 of the molded body 600 of the first optoelectronic component 10 may serve for electrically contacting the first optoelectronic component 10. The first optoelectronic component 10 may be formed, for example, as a surface-mountable SMD component and be provided for an electrical contacting by reflow soldering.

If a suitable electrical voltage is applied to the first optoelectronic component 10 via the first soldering contact pad 710 and the second soldering contact pad 720, then said electrical voltage is present at the optoelectronic semiconductor chip 200 via the rear-side electrical connection face 220 and the front-side electrical connection face 210 of the optoelectronic semiconductor chip 200 and causes the latter to emit electromagnetic radiation, for example, visible light.

Electromagnetic radiation emitted on the front side 201 of the optoelectronic semiconductor chip 200 may be emitted directly from the first optoelectronic component 10. Electromagnetic radiation that is emitted at side faces of the optoelectronic semiconductor chip 200 that connect the front side 201 to the rear side 202 of the optoelectronic semiconductor chip 200 may pass through the potting material 500 surrounding the optoelectronic semiconductor chip 200 to the reflector 400 and is reflected by the latter in the direction of the front side 601 of the molded body 600, where said electromagnetic radiation may also emerge from the first optoelectronic component 10 and is emitted from the first optoelectronic component 10.

The molded body 600 forms the housing and the carrying part of the first optoelectronic component 10. The molded body 600 carries the optoelectronic semiconductor chip 200 and the soldering contact pads 710, 720 of the first optoelectronic component 10. A further carrier is not necessary and is not present.

It is possible, by means of the method described with reference to FIGS. 1 to 8, to produce a plurality of first optoelectronic components 10 in parallel in common work processes. For this purpose, the carrier 100 and the carrier film 110 are provided with a sufficient lateral size. Afterward, a plurality of optoelectronic semiconductor chips 200 and a plurality of contact elements 300 are arranged on the top side 111 of the carrier film 110, for example, in a regular two-dimensional matrix arrangement. Here in each case one optoelectronic semiconductor chip 200 and one contact element 300 form a pair from which a first optoelectronic component 10 is formed later. Per first optoelectronic component 10 to be formed, a reflector 400 comprising an embossed reflector structure is arranged on the top side 111 of the carrier film 110. It is also possible to use an integral reflector 400 comprising an embossed reflector structure per optoelectronic semiconductor chip 200. In the subsequent processing step, the regions between the optoelectronic semiconductor chips 200 and the respectively assigned reflector structure of the reflector 400 or the plurality of reflectors 400 are filled with the potting material 500. The optoelectronic semiconductor chips 200, the contact elements 300 and the reflectors 400 of all the first optoelectronic components 10 to be formed are then embedded into a common molded body 600. The molded body 600 thus formed may also be referred to as a panel and comprise, for example, the form of a wafer. After detaching the molded body 600 from the top side 111 of the carrier film 110 and removing the part 610 of the molded body 600 that adjoins the rear side 602, the metallization 700 is arranged on the front side 601 and the rear side 602 of the molded body 600 such that a first soldering contact pad 710, a second soldering contact pad 720 and a connection section 730 are formed per first optoelectronic component 10 to be formed. It is only then that the individual first optoelectronic components 10 are singulated by dividing the molded body 600.

Figure 9:
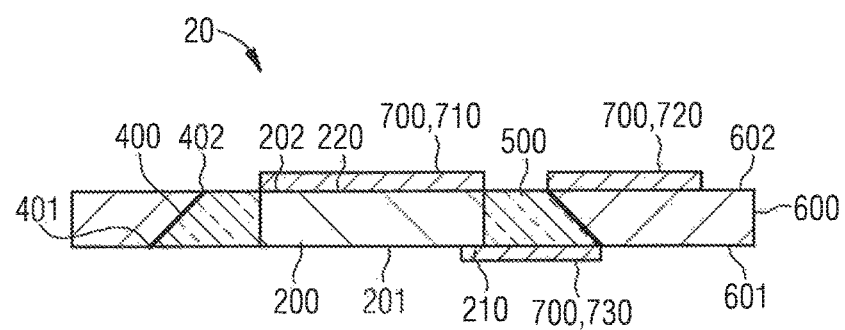
FIG. 9 shows a sectional side view of a second optoelectronic component.

FIG. 9 shows a schematic sectional side view of a second optoelectronic component 20. The second optoelectronic component 20 and the method serving for producing the second optoelectronic component 20 comprise great correspondences to the first optoelectronic component 10 and the method for producing the first optoelectronic component 10 explained with reference to FIGS. 1 to 8. Mutually corresponding component pairs of the first optoelectronic component 10 and of the second optoelectronic component 20 are provided with the same reference signs in FIGS. 8 and 9.

The second optoelectronic component 20 differs from the first optoelectronic component 10 in that the contact element 300 of the first optoelectronic component 10 is not present in the case of the second optoelectronic component 20. Instead, in the case of the second optoelectronic component 20, the reflector 400 serves to provide an electrically conductive connection between the front side 601 of the molded body 600 and the rear side 602 of the molded body 600. In the case of the second optoelectronic component 20, the second soldering contact pad 720 is arranged on the rear side 602 of the molded body 600 and the rear side 402 of the reflector 400 embedded into the molded body 600 in such a way that an electrically conductive connection exists between the reflector 400 and the second soldering contact pad 720. In the case of the second optoelectronic component 20, the connection section 730 is arranged on the front side 601 of the molded body 600, the front side 201 of the optoelectronic semiconductor chip 200 and the front side 401 of the reflector 400 in such a way that an electrically conductive connection exists between the connection section 730 and the front-side electrical connection face 210 of the optoelectronic semiconductor chip 200, said front-side electrical connection face being arranged on the front side 201 of the optoelectronic semiconductor chip 200, and an electrically conductive connection exists between the connection section 730 and the reflector 400. The connection section 730 and the reflector 400 thus produce an electrically conductive connection between the second soldering contact pad 720 of the second optoelectronic component 20 and the front-side electrical connection face 210 of the optoelectronic semiconductor chip 200 of the second optoelectronic component 20.

The second optoelectronic component 20 has the advantage over the first optoelectronic component 10 that it may be produced more cost-effectively and formed with more compact external dimensions as a result of the omission of the contact element 300 embedded into the molded body 600.

It is possible to use, instead of the optoelectronic semiconductor chip 200 comprising the front-side electrical connection face 210 arranged on the front side 201 and the rear-side electrical connection face 220 arranged on the rear side 202, an optoelectronic semiconductor chip in which both electrical connection faces are arranged on the front side or on the rear side of the optoelectronic semiconductor chip.

If both electrical connection faces are arranged on the front side of the optoelectronic semiconductor chip, then the optoelectronic component produced with this optoelectronic semiconductor chip may comprise two contact elements embedded into the molded body (formed like the contact element 300 of the first optoelectronic component 10), said contact elements being embedded into the molded body and being electrically conductively connected to the two electrical connection faces of the optoelectronic semiconductor chip via two connection sections (formed like the connection section 730 of the first optoelectronic component 10). The first soldering contact pad and the second soldering contact pad of this optoelectronic component are then arranged on the undersides of the two contact elements.

If both electrical connection faces of the optoelectronic semiconductor chip are formed on the rear side thereof, then the soldering contact pads of the optoelectronic component produced with this optoelectronic semiconductor chip are both arranged on the rear side of the optoelectronic semiconductor chip. In this case, for the optoelectronic component it is possible in turn to dispense with providing contact elements such as the contact element 300 of the first optoelectronic component 10.

The invention has been illustrated and described in greater detail on the basis of the preferred exemplary embodiments. Nevertheless, the invention is not restricted to the examples disclosed. Rather, variations may be derived therefrom by the person skilled in the art, without departing from the scope of protection of the invention.

The invention claimed is:

1. A method for producing an optoelectronic component, the method comprising:
 arranging an optoelectronic semiconductor chip and a reflector on a top side of a carrier film;
 arranging a potting material in a region between the optoelectronic semiconductor chip and the reflector; and
 forming a molded body, wherein the optoelectronic semiconductor chip, the reflector and the potting material are embedded into the molded body.

2. The method according to claim 1, further comprising removing a part of the molded body in order to at least partly uncover a surface of the optoelectronic semiconductor chip facing away from the carrier film when forming the molded body comprises covering the surface of the optoelectronic semiconductor chip facing away from the carrier film.

3. The method according to claim 1, wherein the molded body is formed such that the reflector is uncovered on a rear side of the molded body facing away from the carrier film.

4. The method according to claim 1, further comprising detaching the molded body from the carrier film.

5. The method according to claim 1, further comprising arranging a metallization on a front side and/or a rear side of the molded body.

6. The method according to claim 5, wherein the metallization provides an electrically conductive connection between an electrical connection face of the optoelectronic semiconductor chip and the reflector.

7. The method according to claim 1, further comprising an electrically conductive contact element arranged on the top side of the carrier film, wherein the electrically conductive contact element is embedded together with the optoelectronic semiconductor chip into the molded body, and wherein the contact element provides an electrically conductive connection between a front side and a rear side of the molded body.

8. The method according to claim 7, further comprising a metallization, wherein the metallization provides an electrically conductive connection between an electrical connection face of the optoelectronic semiconductor chip and the contact element.

9. The method according to claim 1, wherein the reflector is arranged on the carrier film before the optoelectronic semiconductor chip is arranged on the carrier film.

10. The method according to claim 1, wherein the reflector includes a metal sheet comprising embossing structures.

11. The method according to claim 1, wherein the optoelectronic semiconductor chip is arranged on the carrier film such that a light-emitting surface of the optoelectronic semiconductor chip faces the carrier film.

12. The method according to claim 1, wherein the optoelectronic semiconductor chip is a volume emitting light-emitting diode chip.

13. The method according to claim 1, wherein arranging the potting material comprising performing a dosing method.

14. The method according to claim 1, wherein the potting material is arranged such that a surface of the optoelectronic semiconductor chip facing away from the carrier film is not covered by the potting material.

15. The method according to claim 1, wherein forming the molded body comprises compression molding.

16. The method according to claim 1, wherein a plurality of optoelectronic semiconductor chips is embedded into the molded body, and wherein the method further comprises dividing the molded body in order to obtain a plurality of optoelectronic components.

17. An optoelectronic component comprising:
an optoelectronic semiconductor chip and a reflector,
wherein a potting material is arranged in a region between the optoelectronic semiconductor chip and the reflector,
wherein the optoelectronic semiconductor chip, the reflector and the potting material are embedded into a molded body,
wherein a front side of the optoelectronic semiconductor chip terminates flush with a front side of the molded body, and
wherein a rear side of the optoelectronic semiconductor chip terminates flush with a rear side of the molded body.

18. The optoelectronic component according to claim 17, further comprising an electrically conductive contact element embedded into the molded body, wherein a front side of the contact element terminates flush with the front side of the molded body, and wherein a rear side of the contact element terminates flush with the rear side of the molded body.

* * * * *